United States Patent
Tao et al.

(10) Patent No.: US 12,532,572 B2
(45) Date of Patent: Jan. 20, 2026

(54) PHOTOVOLTAIC MODULE AND MANUFACTURING METHOD FOR PHOTOVOLTAIC MODULE

(71) Applicants: JINKO SOLAR CO., LTD., Jiangxi (CN); ZHEJIANG JINKO SOLAR CO., LTD., Zhejiang (CN)

(72) Inventors: Wusong Tao, Shangrao (CN); Luchuang Wang, Shangrao (CN); Xiangchao Han, Shangrao (CN); Liang Guo, Shangrao (CN)

(73) Assignees: JINKO SOLAR CO., LTD., Shangrao (CN); ZHEJIANG JINKO SOLAR CO., LTD., Haining (CN)

(*) Notice: Subject to any disclaimer, the term of this patent is extended or adjusted under 35 U.S.C. 154(b) by 0 days.

(21) Appl. No.: 18/362,940

(22) Filed: Jul. 31, 2023

(65) Prior Publication Data
US 2024/0363770 A1 Oct. 31, 2024

(30) Foreign Application Priority Data
Apr. 28, 2023 (CN) .......................... 202310483557.4

(51) Int. Cl.
*H10F 19/85* (2025.01)
*H10F 19/20* (2025.01)
(Continued)

(52) U.S. Cl.
CPC ........... *H10F 77/311* (2025.01); *H10F 19/85* (2025.01); *H10F 71/137* (2025.01); *H10F 19/20* (2025.01)

(58) Field of Classification Search
CPC ......... H10F 77/311; H10F 19/35; H10F 19/90
See application file for complete search history.

(56) References Cited

U.S. PATENT DOCUMENTS

| 4,132,570 A | * | 1/1979 | Caruso | H10F 19/902 136/251 |
| 2001/0015220 A1 | * | 8/2001 | Benz | H10F 19/85 438/66 |

(Continued)

FOREIGN PATENT DOCUMENTS

| CN | 204834644 U | 12/2015 |
| CN | 103367549 B | 8/2016 |

(Continued)

OTHER PUBLICATIONS

Japanese Office Action for Application No. JP2023-115534, mailed Mar. 22, 2024 (12 pages).

(Continued)

*Primary Examiner* — Sadie White
(74) *Attorney, Agent, or Firm* — Wiersch Law Group

(57) ABSTRACT

A photovoltaic module and a method for a photovoltaic module are provided. The photovoltaic module includes a photovoltaic cell pack, a front packaging structure, and a back packaging structure. The photovoltaic cell pack includes solar cell strings spaced apart along a width direction of the photovoltaic module. The front packaging structure is arranged on a light-facing surface of the photovoltaic cell pack, and the front packaging structure includes a front sheet and a front packaging layer. The back packaging structure is arranged on a backlight surface of the photovoltaic cell pack, and the back packaging structure includes a back sheet and a back packaging layer. The back sheet and the front sheet jointly clamp the front packaging layer, the photovoltaic cell pack, and the back packaging layer. A distance L1 between two adjacent solar cell strings along the width direction of the photovoltaic module satisfies: 0.3 mm≤L1≤1.5 mm.

16 Claims, 8 Drawing Sheets

(51) Int. Cl.
*H10F 71/00* (2025.01)
*H10F 77/30* (2025.01)

(56) References Cited

U.S. PATENT DOCUMENTS

| | | | | |
|---|---|---|---|---|
| 2010/0243027 | A1* | 9/2010 | Tsujimoto | H10F 19/80 |
| | | | | 136/252 |
| 2011/0197951 | A1* | 8/2011 | Abiko | B23P 11/022 |
| | | | | 136/246 |
| 2014/0020735 | A1* | 1/2014 | Watanabe | H10F 19/804 |
| | | | | 136/251 |
| 2014/0209151 | A1 | 7/2014 | Kim et al. | |
| 2016/0268964 | A1* | 9/2016 | Maekawa | H10F 77/48 |
| 2017/0288069 | A1* | 10/2017 | Hashimoto | H10F 71/00 |
| 2019/0028057 | A1* | 1/2019 | Huang | H10F 19/00 |
| 2020/0135953 | A1* | 4/2020 | Kim | H10F 19/906 |
| 2021/0391484 | A1* | 12/2021 | Tao | H10F 19/904 |
| 2022/0149226 | A1 | 5/2022 | Zhang et al. | |

FOREIGN PATENT DOCUMENTS

| | | |
|---|---|---|
| CN | 108022992 A | 5/2018 |
| CN | 207706124 U | 8/2018 |
| CN | 111416009 A | 7/2020 |
| CN | 112436064 A | 3/2021 |
| CN | 112563358 A | 3/2021 |
| CN | 212874503 U | 4/2021 |
| CN | 212934629 U | 4/2021 |
| CN | 212934634 U | 4/2021 |
| CN | 215933619 U | 3/2022 |
| CN | 217822827 U | 11/2022 |
| CN | 218351479 U | 1/2023 |
| CN | 218414592 U | 1/2023 |
| CN | 218568847 U | 3/2023 |
| CN | 218632067 U | 3/2023 |
| CN | 218769566 U | 3/2023 |
| EP | 2688112 A2 | 1/2014 |
| JP | 2004111952 A | 4/2004 |
| JP | 2012038778 A | 2/2012 |
| KR | 20180003681 U | 12/2018 |
| KR | 20210149378 A | 12/2021 |
| WO | 2017037231 A1 | 3/2017 |

OTHER PUBLICATIONS

Australian Office Action for Application No. 2023208147, mailed May 31, 2024 (12 pages).

European Search Report issued in corresponding EP Application 23187613.7, issued Jul. 19, 2024, 11 pages.

Korean Office Action for Application No. 10-2023-0094025, mailed Jul. 18, 2024 (16 pages).

Flip-Flop-Cell-Interconnection-Enabled-by-an-Extremely-High-Bifacial-Factor-of-Screen-Printed-Ion-Implanted-N-PERT-Si-Solar-Cells.

Chinese Grant of Patent for Application No. 202310483557.4, mailed Jun. 20, 2025 (5 pages).

Patent Search Report, mailed Apr. 13, 2023 (10 pages).

* cited by examiner

PHOTOVOLTAIC MODULE AND MANUFACTURING METHOD FOR PHOTOVOLTAIC MODULE

TECHNICAL FIELD

The present disclosure relates to the technical field of photovoltaic power generation, and in particular, to a photovoltaic module and a manufacturing method for a photovoltaic module.

BACKGROUND

Solar energy is an inexhaustible renewable energy source for human beings. A photovoltaic module is a core part in a solar power generation system and is also the most important part in the solar power generation system, whose function is to convert solar energy into electrical energy and send the electrical energy to a storage battery for storage or push a load to operate. The photovoltaic module generally includes a front packaging structure, a back packaging structure, and a photovoltaic cell pack. The photovoltaic cell pack is formed by solar cell strings connected in series or in parallel. A certain distance is required between two adjacent solar cell strings, so as to prevent short-circuiting caused by mutual contact between the adjacent solar cell strings.

In the related art, the solar cell has a relatively small size, resulting in low power generation per unit area of the photovoltaic module, so an existing photovoltaic module has a problem of low photoelectric conversion efficiency.

SUMMARY

The present disclosure provides a photovoltaic module and a manufacturing method for a photovoltaic module, which can improve photoelectric conversion efficiency of the photovoltaic module.

According to a first aspect of the present disclosure, a photovoltaic module is provided, the photovoltaic module including:
- a photovoltaic cell pack, the photovoltaic cell pack including solar cell strings spaced apart along a width direction of the photovoltaic module;
- a front packaging structure arranged on a light-facing surface of the photovoltaic cell pack, the front packaging structure including a front sheet and a front packaging layer; and
- a back packaging structure arranged on a backlight surface of the photovoltaic cell pack, the back packaging structure including a back sheet and a back packaging layer, the back sheet and the front sheet jointly clamping the front packaging layer, the photovoltaic cell pack, and the back packaging layer;
- wherein a distance L1 between two adjacent solar cell strings (11) along the width direction of the photovoltaic module satisfies: 0.3 mm≤L1≤1.5 mm.

In an embodiment, the photovoltaic module further includes limiting members, each of the limiting members is located between two adjacent solar cell strings; each of the limiting members includes a main body portion, at least part of the main body portion is clamped between the two adjacent solar cell strings.

In an embodiment, a height H1 of each of the limiting members along a height direction of the photovoltaic module satisfies: 0.5 mm≤H1≤3 mm.

In an embodiment, the limiting members are made of an insulating material; and the limiting members are made of one of an adhesive film, transparent glass, a cured insulating adhesive, a transparent plastic plate, and transparent rubber.

In an embodiment, the limiting members and the front packaging layer are integrally formed, at least one of the limiting members and the front packaging layer define an accommodation space, and the solar cell string is located in the accommodation space; and/or the limiting members and the back packaging layer are integrally formed, at least one of the limiting members and the back packaging layer define an accommodation space, and the solar cell string is located in the accommodation space.

In an embodiment, each of the limiting members further includes a first connecting portion and a second connecting portion, the first connecting portion and the second connecting portion are fixedly connected to two ends of the main body portion along a height direction of the photovoltaic module; and an upper surface of the first connecting portion is connected to the front packaging layer, and a lower surface of the second connecting portion is connected to the back packaging layer.

In an embodiment, a cross-section of each of the limiting members is Z-shaped; and a lower surface of the first connecting portion is connected to the light-facing surface of a corresponding solar cell string, and an upper surface of the second connecting portion is connected to the backlight surface of another adjacent solar cell string.

In an embodiment, a cross-section of each of the limiting members is C-shaped;
and a lower surface of the first connecting portion and an upper surface of the second connecting portion are respectively connected to the light-facing surface and the backlight surface of a same solar cell string.

In an embodiment, limiting members are arranged between two adjacent solar cell strings, the plurality of limiting members are spaced apart along a length direction of the photovoltaic module.

In an embodiment, the each of the solar cell strings includes solar cells arranged along a length direction of the photovoltaic module, and each of the solar cells has a first dimension D1 along the width direction of the photovoltaic module, and each of the solar cells has a second dimension D2 along the length direction of the photovoltaic module; wherein each of the solar cells has two slices, and D1:D2 satisfies: 2<D1:D2≤2.02; or the each of solar cells has three slices, and D1:D2 satisfies: 3.01≤D1:D2≤3.03; or each of the solar cells has four slices, and D1:D2 satisfies: 4.01≤D1:D2≤4.04.

According to a second aspect of the present disclosure, a manufacturing method for manufacturing a photovoltaic module is provided, wherein the method includes the following steps:
- providing a photovoltaic cell pack, the photovoltaic cell pack including solar cell strings;
- providing a front packaging structure and a back packaging structure, the front packaging structure including a front sheet and a front packaging layer, the back packaging structure including a back sheet and a back packaging layer;
- stacking the front sheet, the front packaging layer, the photovoltaic cell pack, the back packaging layer, and the back sheet, and arranging the solar cell strings spaced apart in a width direction of the photovoltaic module, wherein a distance L1 between two adjacent solar cell strings satisfies: 0.3 mm≤L1≤1.5 mm; and
- laminating the front sheet, the front packaging layer, the photovoltaic cell pack, the back packaging layer, and the back sheet to form the photovoltaic module.

In an embodiment, when the solar cell strings are spaced apart in the width direction of the photovoltaic module, the method includes: arranging a limiting member between two adjacent solar cell strings, and clamping at least part of a main body portion of the limiting member between the two adjacent solar cell strings.

In an embodiment, when the limiting member is arranged between two adjacent solar cell strings, the method includes: placing the solar cell strings and the limiting member sequentially along the width direction of the photovoltaic module.

In an embodiment, the limiting member further includes a first connecting portion and a second connecting portion, the first connecting portion and the second connecting portion are fixedly connected to two ends of the main body portion along a height direction of the photovoltaic module; and a cross-section of the limiting member is Z-shaped, and when the solar cell strings and the limiting member are placed sequentially along the width direction of the photovoltaic module, the method includes: placing one of the solar cell strings; placing the limiting member, and connecting one of the first connecting portion and the second connecting portion to the solar cell string; and placing another one of the solar cell strings, and connecting the another one of the solar cell strings to the other of the first connecting portion and the second connecting portion, such that the two adjacent solar cell strings jointly clamp the main body portion.

In an embodiment, the limiting member further includes a first connecting portion and a second connecting portion, the first connecting portion and the second connecting portion are fixedly connected to two ends of the main body portion along a height direction of the photovoltaic module; and a cross-section of the limiting member is C-shaped, and when the limiting member is arranged between two adjacent solar cell strings, the method includes: connecting a lower surface of the first connecting portion and an upper surface of the second connecting portion respectively to the light-facing surface and the backlight surface of a same solar cell string, such that the limiting member is clamped on the solar cell string to form a solar cell string assembly; and placing solar cell string assemblies sequentially along the width direction of the photovoltaic module, such that the two adjacent solar cell strings jointly clamp the main body portion.

In an embodiment, the limiting members and the front packaging layer are integrally formed, at least one limiting member and the front packaging layer define an accommodation space, and when the limiting member is arranged between two adjacent solar cell strings, the method includes: accommodating the solar cell strings in the accommodation space, such that the two adjacent solar cell strings jointly clamp the main body portion; and/or the limiting members and the back packaging layer are integrally formed, at least one limiting member and the back packaging layer define an accommodation space, and when the limiting member is arranged between two adjacent solar cell strings, the method includes: accommodating the solar cell strings in the accommodation space, such that the two adjacent solar cell strings jointly clamp the main body portion.

In an embodiment, before the limiting member is arranged between two adjacent solar cell strings, the method further includes: arranging a positioning tape on the two adjacent solar cell strings, two ends of the positioning tape are respectively bonded to the two adjacent solar cell strings along the width direction of the photovoltaic module; or after the limiting member is arranged between two adjacent solar cell strings, the method further includes: arranging a positioning tape on the two adjacent solar cell strings, two ends of the positioning tape are respectively bonded to the two adjacent solar cell strings along the width direction of the photovoltaic module.

According to the photovoltaic module in the present disclosure, the distance L1 between adjacent solar cell strings is limited to a range from 0.3 mm to 1.5 mm, such that, when a width of the photovoltaic module is constant, a reduced string distance can be compensated for the size of the solar cell, and a dimension of the solar cell along the width direction of the photovoltaic module can be increased. A blank area of layout of the photovoltaic module can be reduced, and a light-receiving area of the photovoltaic cell pack per unit area is increased, thereby increasing power generation per unit area of the photovoltaic module and then improving the photoelectric conversion efficiency of the photovoltaic module.

It should be understood that the general description above and the detailed description in the following are merely illustrative, and cannot limit the present disclosure.

REFERENCE SIGNS

Figure 1:
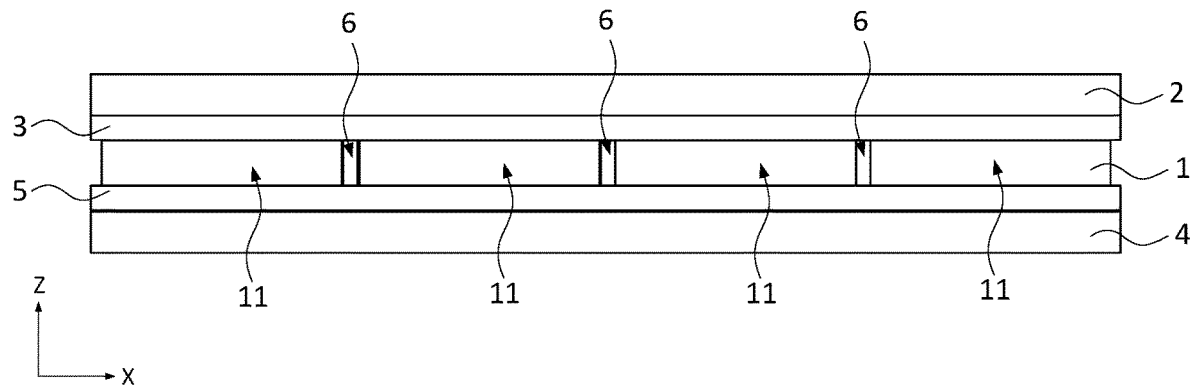
FIG. 1 is a schematic diagram of a sectional structure of a photovoltaic module according to the present disclosure.

1: photovoltaic cell pack;
  11: solar cell string;
    111: solar cell;
2: front sheet;
3: front packaging layer;
4: back sheet;
5: back packaging layer;
6: limiting member;
  61: main body portion;
  62: first connecting portion;
  63: second connecting portion;
7: positioning tape.

The accompanying drawings herein, which are incorporated in and constitute a part of this specification, illustrate embodiments consistent with the present disclosure and, together with the specification, serve to explain principles of the present disclosure.

DESCRIPTION OF EMBODIMENTS

To facilitate a better understanding of the technical solutions of the present disclosure, embodiments of the present disclosure are described in detail below with reference to the accompanying drawings.

It should be made clear that the embodiments described are only some rather than all of the embodiments of the present disclosure. All other embodiments obtained by those of ordinary skill in the art based on the embodiments in the present disclosure without creative efforts fall within the protection scope of the present disclosure.

The terms used in the embodiments of the present disclosure are for the purpose of describing specific embodiments only, and are not intended to limit the present disclosure. As used in the embodiments and the appended claims of the present disclosure, the singular forms of "a/an", "the", and "said" are intended to include plural forms, unless otherwise clearly specified by the context.

It should be understood that the term "and/or" used herein is merely an association relationship describing associated objects, indicating that three relationships may exist. For example, A and/or B indicates that there are three cases of A alone, A and B together, and B alone. In addition, the character "/" herein generally indicates an "or" relationship between the associated objects.

It should be noted that directional terms such as "upper", "lower", "left", and "right" described in the embodiments of the present disclosure are described with reference to the angles shown in the accompanying drawings, and should not be construed as limitations on the embodiments of the present disclosure. In addition, it should also be understood that, in the context, when one element is referred to as being formed "above" or "below" another element, it is possible that the one element is directly formed "above" or "below" the another element, or the element is formed "above" or "below" the other element via an intermediate element.

A photovoltaic module includes a front packaging structure, a back packaging structure, and a photovoltaic cell pack. The photovoltaic cell pack includes solar cell strings spaced apart along a width direction of the photovoltaic module. The solar cell strings are connected in series or in parallel. Each solar cell string is formed by a plurality of solar cells spaced apart along a length direction of the photovoltaic module. The solar cells are connected in series. In the related art, the solar cell has a relatively small size, resulting in low power generation per unit area of the photovoltaic module, thereby affecting photoelectric conversion efficiency of the photovoltaic module.

Based on the above problems, the present disclosure provides a photovoltaic module. As shown in FIG. 1, the photovoltaic module includes a photovoltaic cell pack 1, a front packaging structure, and a back packaging structure. The photovoltaic cell pack 1 includes solar cell strings 11 spaced apart along a width direction X of the photovoltaic module. The front packaging structure is arranged on a light-facing surface of the photovoltaic cell pack 1. The front packaging structure includes a front sheet 2 and a front packaging layer 3. The back packaging structure is arranged on a backlight surface of the photovoltaic cell pack 1. The back packaging structure includes a back sheet 4 and a back packaging layer 5. The back sheet 4 and the front sheet 2 jointly clamp the front packaging layer 3, the photovoltaic cell pack 1, and the back packaging layer 5. A distance L1 between two adjacent solar cell strings 11 along the width direction X of the photovoltaic module satisfies: 0.3 mm≤L1≤1.5 mm.

Figure 2:
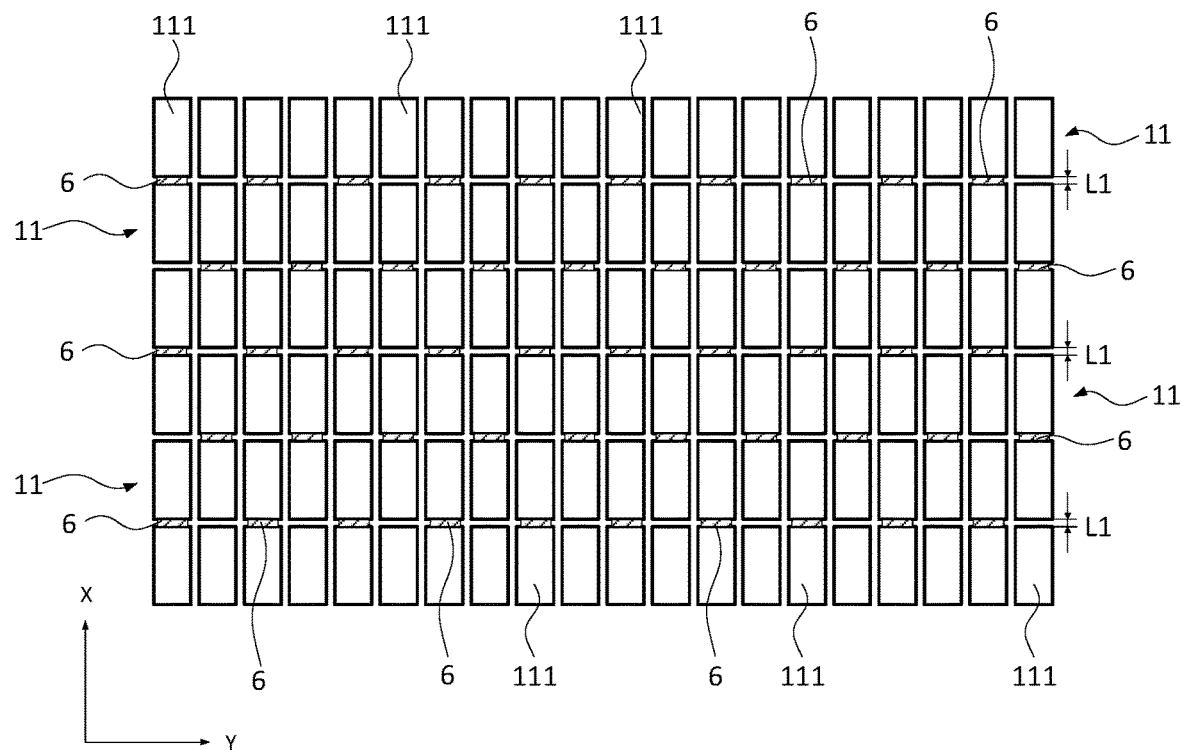
FIG. 2 is a first top view of a photovoltaic cell pack.

In this embodiment, the photovoltaic module is formed by the front sheet 2, the front packaging layer 3, the photovoltaic cell pack 1, the back packaging layer 5, and the back sheet 4 through lamination and packaging. The front sheet 2 is located on a light-facing side of the photovoltaic cell pack 1, and is configured to transmit sunlight and further configured to improve waterproof and moisture-proof capabilities of the photovoltaic module and seal the photovoltaic cell pack 1 together with the back sheet 4. The front packaging layer 3 is configured to protect the light-facing surface of the photovoltaic cell pack 1 (a side surface of the photovoltaic cell pack 1 facing a light source and configured to receive direct sunlight). The back packaging layer 5 is configured to protect the backlight surface of the photovoltaic cell pack 1 (a side surface of the photovoltaic cell pack 1 away from the light source). At the same time, during the lamination of the photovoltaic module, the front packaging layer 3 and the back packaging layer 5 are configured to package and protect the photovoltaic cell pack 1, preventing an influence of an external environment on performance of the photovoltaic cell pack 1, and also bonding the front sheet 2, the back sheet 4, and the photovoltaic cell pack 1 into an entirety. As shown in FIG. 2, each solar cell string 11 includes a plurality of solar cells 111 arranged along a length direction Y of the photovoltaic module. The distance L1 is a distance between two solar cells 111, which is aligned along the width direction X of the photovoltaic module, of two adjacent solar cell strings 11. The distance L1 may be, for example, 0.3 mm, 0.4 mm, 0.5 mm, 0.6 mm, 0.7 mm, 0.8 mm, 0.9 mm, 1 mm, 1.1 mm, 1.2 mm, 1.3 mm, 1.4 mm, or 1.5 mm, or may be other values in the above range, which is not limited herein.

During the manufacturing of the photovoltaic module, affected by a material of the solar cell 111, the solar cell 111 may expand. Moreover, due to the influence of factors such as a vacuumizing step in the lamination process and flowing of materials of the front packaging layer 3 and the back packaging layer 5, the solar cell string 11 may have certain displacement along the width direction X of the photovoltaic module. In a case where the width of the photovoltaic module is fixed, if the distance L1 is excessively small (e.g., less than 0.3 mm), two adjacent solar cell strings 11 are likely to be close to each other during the manufacturing of the photovoltaic module, such that two adjacent solar cells 111 along the width direction X of the photovoltaic module contact each other, causing short-circuiting of the photovoltaic module, and even the solar cells 111 of the two adjacent solar cell strings 11 may be misplaced and overlap, resulting in hidden cracks in the solar cells 111 during the lamination.

In a case where the width of the photovoltaic module is fixed, if the distance L1 is excessively large (e.g., greater than 1.5 mm), a dimension of the solar cell 111 in the width direction X of the photovoltaic module may be limited, resulting in a smaller effective light-receiving area of the photovoltaic module, an influence on power generation per unit area of the photovoltaic module, and lower photoelectric conversion efficiency of the photovoltaic module.

Therefore, the distance L1 between two adjacent solar cell strings 11 along the width direction X of the photovoltaic module should range from 0.3 mm to 1.5 mm, and range from 0.3 mm to 1 mm in some embodiments, which can prevent short-circuiting of the photovoltaic module while improving the photoelectric conversion efficiency of the photovoltaic module, thereby ensuring a yield of the photovoltaic module. In the related art, the string distance between adjacent solar cell strings 11 generally ranges from 1.6 mm to 2.5 mm, while according to the photovoltaic module in the present disclosure, the distance L1 between the adjacent solar cell strings 11 is limited to a range from 0.3 mm to 1.5 mm, such that, when the width of the photovoltaic module is constant, a reduced string distance can be compensated for the size of the solar cell 111, and a dimension of the solar cell 111 along the width direction X of the photovoltaic module can be increased. A blank area of layout of the photovoltaic module can be reduced, and a light-receiving area of the photovoltaic cell pack per unit area is increased, thereby increasing power generation per unit area of the photovoltaic module and then improving the photoelectric conversion efficiency of the photovoltaic module.

In this embodiment, a plurality of solar cells 111 are connected in series along the length direction Y of the photovoltaic module to form a solar cell string 11. Solar cell strings 11 are arranged along the width direction X of the photovoltaic module. The solar cell strings 11 are connected in series or in parallel to form a solar cell string group. A plurality of solar cell string groups may be connected to each other through parallel connection.

In some embodiments, the solar cells 111 in a same solar cell string 11 may be connected by using a stitch welding technology. That is, the solar cell 111 is cut into half slices along a direction perpendicular to a busbar, a plurality of half slices are arranged in a manner of edge overlapping, and an overlapping width between two adjacent half slices ranges from 0.3 mm to 2.0 mm. Then, two adjacent half slices are connected through a flexible round wire tinned copper strip with a diameter ranging from 0.1 mm to 0.35 mm, and no busbar electrode pad is arranged in an overlapping region of the solar cell. That is, a solder strip is not bonded to the busbar of the solar cell. The connection by stitch welding can eliminate the distance between adjacent solar cells 111 in a same solar cell string 11, which is conducive to increasing a dimension of the solar cell 111 along the length direction Y of the photovoltaic module and increasing an effective light-receiving area of the photovoltaic module, thereby improving photoelectric conversion efficiency of the photovoltaic cell pack.

Figure 3:
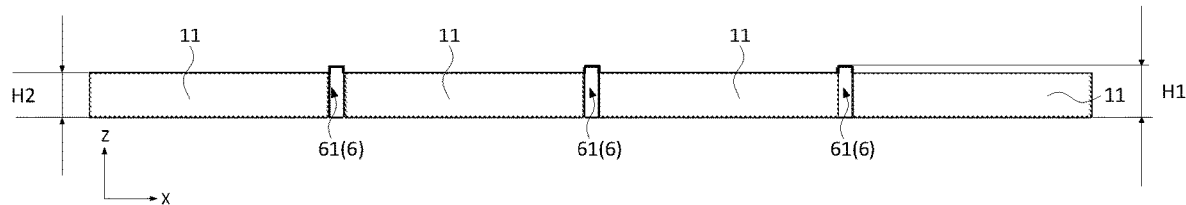
FIG. 3 is a schematic diagram of a sectional structure of the photovoltaic cell pack in FIG. 2 in some embodiments.

In one or more embodiments, as shown in FIG. 1 and FIG. 3, the photovoltaic module further includes limiting members 6, each of the limiting members 6 is located between two adjacent solar cell strings 11, the limiting member 6 includes a main body portion 61, and at least part of the main body portion 61 is clamped between two adjacent solar cell strings 11.

The limiting member 6 is made of an insulating material, and when the limiting member 6 is arranged between two solar cell strings 11, short-circuiting caused by contact between the solar cells 111 of adjacent solar cell strings 11 can be prevented. Moreover, along the width direction X of the photovoltaic module, the solar cell strings 11 and the main body portions 61 are alternately arranged, and the main body portion 61 is clamped between two adjacent solar cell strings 11. This structure can limit the solar cell strings 11 in the width direction X of the photovoltaic module, and prevent displacement of the solar cell strings 11 during the stacking or lamination of the photovoltaic module, so as to ensure a constant distance L1 between two adjacent solar cell strings 11.

In one or more embodiments, a material of the limiting member 6 is an insulating material. For example, the limiting member 6 is made of one of an adhesive film, transparent glass, a cured insulating adhesive, a transparent plastic plate, and transparent rubber. In addition to a good insulation effect, the above materials also have a good light transmission effect, which may not affect the photoelectric conversion efficiency of the photovoltaic module. When the limiting member 6 is made of the transparent plastic plate, the material of the limiting member 6 may be one of Polymethyl Methacrylate (PMMA), Polycarbonate (PC), Polyethylene Terephthalate (PET), Polypropylene (PP), and Polyvinyl chloride (PVC). When the limiting member 6 is made of the cured insulating adhesive, a material of the insulating adhesive may be one or more of silicone, acrylic, and epoxy resin. When the limiting member 6 is made of the transparent rubber, the material of the limiting member 6 may be one of ethylene-propylene rubber, ethylene-vinyl acetate, epichlorohydrin rubber, and butyl rubber.

In some embodiments, when the limiting member 6 is made of the adhesive film, a material of the adhesive film may be one of an Ethylene-Vinyl Acetate Copolymer (EVA), a Polyolefin Elastomer (POE), and Polyvinyl Butyral (PVB), or may be an EPE adhesive film (an EVA-POE-EVA co-extrusion structure) or an EP adhesive film (an EVA-EP co-extrusion structure). During the lamination of the photovoltaic module, the limiting member 6 made of the above material in the form of the adhesive film can be melted together with the front packaging layer 3 and the back packaging layer 5. Along the width direction X of the photovoltaic module, the limiting member 6 may play a role of connecting two adjacent solar cell strings 11. Along a height direction Z of the photovoltaic module, the limiting member 6 may play a role of connecting the front packaging layer 3 and the back packaging layer 5.

A specific structure of the limiting member 6 is not limited, which may have a hollow structure.

It is to be noted that various embodiments in the present disclosure are all described based on an example in which the limiting member 6 is made of an adhesive film. However, the limiting member 6 may be made of the other materials described above, which is not limited in the present disclosure.

For example, the limiting member 6 is made of an adhesive film with a grammage of 300 g/m$^2$. When the value of the distance L1 varies, specific yields and power of the photovoltaic module are shown in the table below:

| Distance L1/mm | Yield of the photovoltaic module | Power of the photovoltaic module/W | Cost of the photovoltaic module (the cost is 100% when the distance L1 is 0.6 mm) | Cost of a solar cell silicon wafer (the cost is 100% when the distance L1 is 1.9 mm) |
|---|---|---|---|---|
| 1.9 | 99.9% | 533.6 | 114% | 100% |
| 1.7 | 98.7% | 534.1 | 112% | 101.5% |
| 1.5 | 97.8% | 534.6 | 110% | 102.5% |
| 1.3 | 96.7% | 535.1 | 107% | 103.8% |
| 1.1 | 95.9% | 535.6 | 105% | 104.7% |
| 0.9 | 94.8% | 536.1 | 103% | 107% |
| 0.6 | 93.2% | 536.9 | 1 | 110% |
| 0.5 | 92.1% | 537.1 | 102% | 115% |
| 0.3 | 91.2% | 537.6 | 105% | 120% |
| 0.2 | 80.5% | 538.1 | 108% | 125% |
| 0.1 | 55.7% | 538.6 | 112% | 130% |

As shown in the table above, when the distance L1≤0.3 mm (e.g., L1=0.2 mm or L1=0.1 mm), the yield of the photovoltaic module may decrease significantly. Therefore, the distance L1 is required to be greater than 0.3 mm.

In one or more embodiments, as shown in FIG. 3, a height H1 of the limiting member 6 along the height direction Z of the photovoltaic module satisfies: 0.5 mm≤H1≤3 mm. H1 may be, for example, 0.5 mm, 1 mm, 1.5 mm, 1.8 mm, 2.3 mm, or 3 mm, or may be other values in the above range, which is not limited herein.

When the height H1 of the limiting member 6 is excessively small (e.g., less than 0.5 mm), the limiting member 6 has a poor isolation effect on the adjacent solar cell strings 11, and there is still a risk of contact between two adjacent solar cell strings 11. When the height H1 of the limiting member 6 is excessively large (e.g., greater than 3 mm), the photovoltaic module may produce bubbles during the lamination, which affects packaging and sealing performance of the photovoltaic module. Therefore, when H1 ranges from 0.5 mm to 3 mm, the limiting member 6 can play a role of isolating adjacent solar cell strings 11, and generation of bubbles by the photovoltaic module during the packaging can be prevented.

Figure 4:
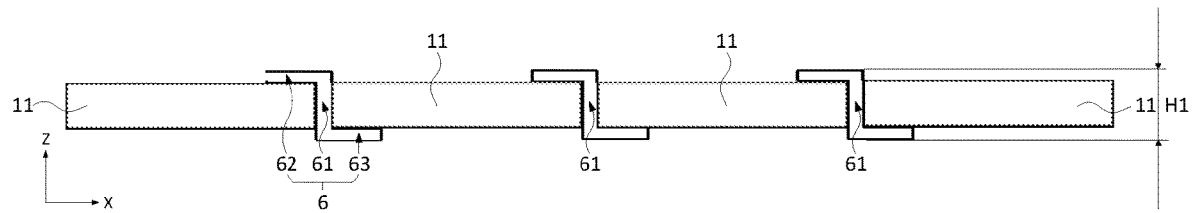
FIG. 4 is a schematic diagram of a sectional structure of the photovoltaic cell pack in FIG. 2 in some embodiments.
Figure 5:
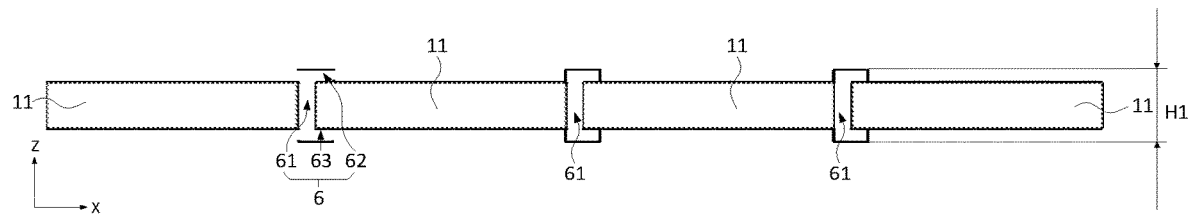
FIG. 5 is a schematic diagram of a sectional structure of the photovoltaic cell pack in FIG. 2 in some embodiments.

In one or more embodiments, as shown in FIG. 4 and FIG. 5, the limiting member 6 further includes a first connecting portion 62 and a second connecting portion 63, and the first connecting portion 62 and the second connecting portion 63 are fixedly connected to two ends of the main body portion 61 along a height direction Z of the photovoltaic module. An upper surface of the first connecting portion 62 is used to connect the front packaging layer 3, and a lower surface of the second connecting portion 63 is used to connect the back packaging layer 5.

With the arrangement of the first connecting portion 62 and the second connecting portion 63, a contact area between the limiting member 6 and the solar cell string 11 can be increased, so as to improve an insulating effect of the limiting member 6. During the lamination of the photovoltaic module, the first connecting portion 62 and the second connecting portion 63 may play a same role as the front packaging layer 3 and the back packaging layer 5, and improve stability of a connection of the photovoltaic cell pack 1 with the front sheet 2 and the back sheet 4, such that the photovoltaic module achieves a better packaging effect.

Sizes and shapes of the first connecting portion 62 and the second connecting portion 63 are exactly the same. The first connecting portion 62, the second connecting portion 63, and the main body portion 61 may be integrally formed or of a split structure, which is not limited in this embodiment.

For example, as shown in FIG. 4, a cross-section shape of the limiting member 6 is Z-shaped, a lower surface of the first connecting portion 62 is connected to the light-facing surface of the solar cell string 11, and an upper surface of the second connecting portion 63 is connected to the backlight surface of the other adjacent solar cell string 11.

When the cross-section shape of the limiting member 6 is Z-shaped, the first connecting portion 62 can increase a contact area between the limiting member 6 and the solar cell string 11, and the second connecting portion 63 can increase a contact area between the limiting member 6 and the other adjacent solar cell string 11, which helps to improve mounting stability of the limiting member 6. Even if two adjacent solar cell strings 11 have certain displacement along the width direction X of the module, it may not cause displacement of the limiting member 6, ensuring isolation and insulation effects of the limiting member 6 on the two adjacent solar cell strings 11. During the stacking of the photovoltaic module, the first connecting portion 62 can be clamped by the front packaging layer 3 and the solar cell string 11, and the second connecting portion 63 can be clamped by the back packaging layer 5 and the other adjacent solar cell string 11, further fixing the position of the limiting member 6.

In some embodiments, the first connecting portion 62, the second connecting portion 63, and the main body portion 61 are integrally formed, forming a Z-shaped structure by bending.

In some other embodiments, as shown in FIG. 5, a cross-section shape of the limiting member 6 is C-shaped, a lower surface of the first connecting portion 62 and an upper surface of the second connecting portion 63 are respectively connected to the light-facing surface and the backlight surface of a same solar cell string 11.

When the cross-section shape of the limiting member 6 is C-shaped, both the first connecting portion 62 and the second connecting portion 63 are connected to a same solar cell string 11, which can increase a contact area between the limiting member 6 and the solar cell string 11. The limiting member 6 is clamped on the solar cell string 11, which is beneficial to improve mounting stability of the limiting member 6 and ensures isolation and insulation effects of the limiting member 6 on the two adjacent solar cell strings 11. During the stacking of the photovoltaic module, the first connecting portion 62 can be clamped by the front packaging layer 3 and the solar cell string 11, and the second connecting portion 63 can be clamped by the back packaging layer 5 and the other adjacent solar cell string 11, which further fixes the position of the limiting member 6 and ensures isolation and insulation effects of the limiting member 6 on the solar cell strings 11.

In some embodiments, the first connecting portion 62, the second connecting portion 63, and the main body portion 61 are integrally formed, forming a C-shaped structure by bending.

Figure 12:
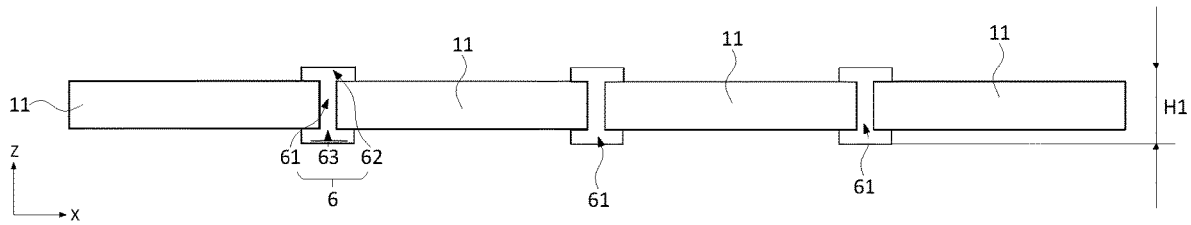
FIG. 12 is a schematic diagram of a sectional structure of the photovoltaic cell pack in FIG. 2 in some embodiments.

As shown in FIG. 12, the cross-section shape of the limiting member 6 may be I-shaped, the lower surface of the first connecting portion 62 is respectively connected to the light-facing surfaces of the two adjacent solar cell strings 11, and the upper surface of the second connecting portion 63 is respectively connected to the backlight surfaces of the two adjacent solar cell strings 11. When this structure is adopted, the mounting stability of the limiting member 6 can also be improved, and the isolation and insulation effects of the limiting member 6 on the two adjacent solar cell strings 11 can be ensured.

Figure 6:
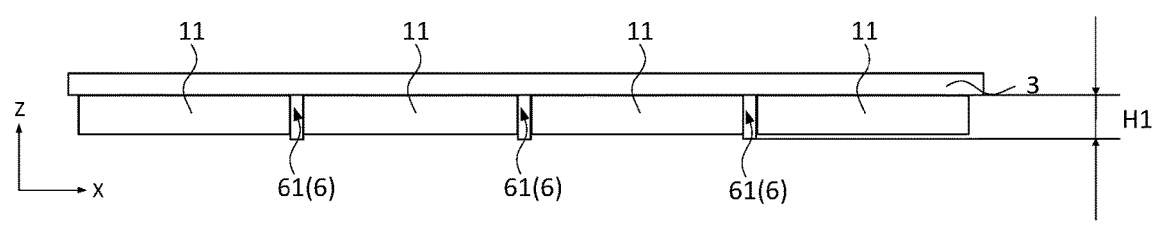
FIG. 6 is a schematic diagram of a sectional structure of the photovoltaic cell pack in FIG. 2 in some embodiments.
Figure 7:
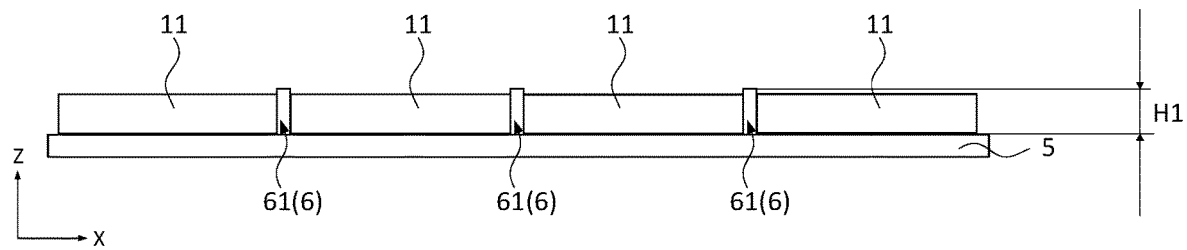
FIG. 7 is a schematic diagram of a sectional structure of the photovoltaic cell pack in FIG. 2 in some embodiments.

In some embodiments, the first connecting portion 62, the second connecting portion 63, and the main body portion 61 are integrally formed. In some other embodiments, as shown in FIG. 6, the limiting members 6 and the front packaging layer 3 are integrally formed, at least one of the limiting members 6 and the front packaging layer 3 define an accommodation space, and the solar cell string 11 is located in the accommodation space. In some other embodiments, as shown in FIG. 7, the limiting members 6 and the back packaging layer 5 are integrally formed, at least one of the limiting members 6 and the back packaging layer 5 define an accommodation space, and the solar cell string 11 is located in the accommodation space.

In this embodiment, as shown in FIG. 6, the limiting member 6 and the front packaging layer 3 may be arranged as an integral structure, and a position of the limiting member 6 on the front packaging layer 3 is arranged according to the dimension of the solar cell 111 along the width direction X of the photovoltaic module. In a stacking step of the photovoltaic module, the solar cell string 11 may be directly placed in the accommodation space defined by the front packaging layer 3 and the limiting member 6. A plurality of accommodation spaces are respectively used to accommodate solar cell strings 11. In this embodiment, as shown in FIG. 7, the limiting member 6 and the back packaging layer 5 may be arranged as an integral structure, and a position of the limiting member 6 on the back packaging layer 5 is arranged according to the dimension of the solar cell 111 along the width direction X of the photovoltaic module. In a stacking step of the photovoltaic module, the solar cell string 11 may be directly placed in the accommodation space defined by the back packaging layer 5 and the limiting member 6. A plurality of accommodation spaces are respectively used to accommodate solar cell strings 11.

When the limiting member 6 and the front packaging layer 3 and/or the back packaging layer 5 are integrally formed, on the one hand, a step of placing the limiting member 6 separately may be saved, so as to improve manufacturing efficiency of the photovoltaic module. On the other hand, the integral structure can ensure a fixed position of the limiting member 6 and ensure stable isolation and insulation effects thereof.

It is to be noted that, when the limiting member 6 and the front packaging layer 3 and/or the back packaging layer 5 are of a split structure, there is a need to arrange the solar cell string 11 and the limiting member 6 in close contact with each other along the width direction X of the photovoltaic module, and a dimension of the limiting member 6 in the width direction X of the photovoltaic module should be equal to a preset distance L1, that is, a width of the limiting member 6 ranges from 0.3 mm to 1.5 mm, so as to ensure a limiting effect of the limiting member 6 on the solar cell string 11, which prevents displacement of the solar cell string 11 during the stacking and the lamination of the photovoltaic module and keep the distance L1 between two adjacent solar cell strings 11 unchanged.

When the limiting member 6 and the front packaging layer 3 and/or the back packaging layer 5 are integrally formed, in principle, in the width direction X of the photovoltaic module, a distance between two adjacent limiting members 6 should be equal to the size of the solar cell 111, and at the same time, a dimension of the limiting member 6 in the width direction X of the photovoltaic module should be equal to a preset distance L1. That is, a width of the limiting member 6 ranges from 0.3 mm to 1.5 mm. However, in order to facilitate the placement of the solar cell string 11 into the accommodation space, the distance between the two limiting members 6 can be appropriately enlarged to be slightly greater than the size of the solar cell 111. That is, when solar cell strings 11 have been arranged, there may be a gap ranging from 0.1 mm to 0.2 mm between the limiting member 6 and the solar cell string 11 along the width direction X of the photovoltaic module. Since the position of the limiting member 6 on the front packaging layer 3 and/or the back packaging layer 5 is fixed, the gap may not affect the limiting effect of the limiting member 6 on two adjacent solar cell strings 11, may not result in excessive large displacement of the solar cell string 11 in the width direction X of the photovoltaic module, and can keep the distance L1 between the two adjacent solar cell strings 11 unchanged.

Since the distance between the two limiting members 6 in the width direction X of the photovoltaic module is enlarged, the width of the limiting member 6 is required to be reduced correspondingly, so as to ensure that the size of the solar cell 111 is not reduced. Therefore, when the limiting member 6 and the front packaging layer 3 and/or the back packaging layer 5 are integrally formed, the width of the limiting member 6 ranges from 0.1 mm to 1.4 mm.

Figure 13:
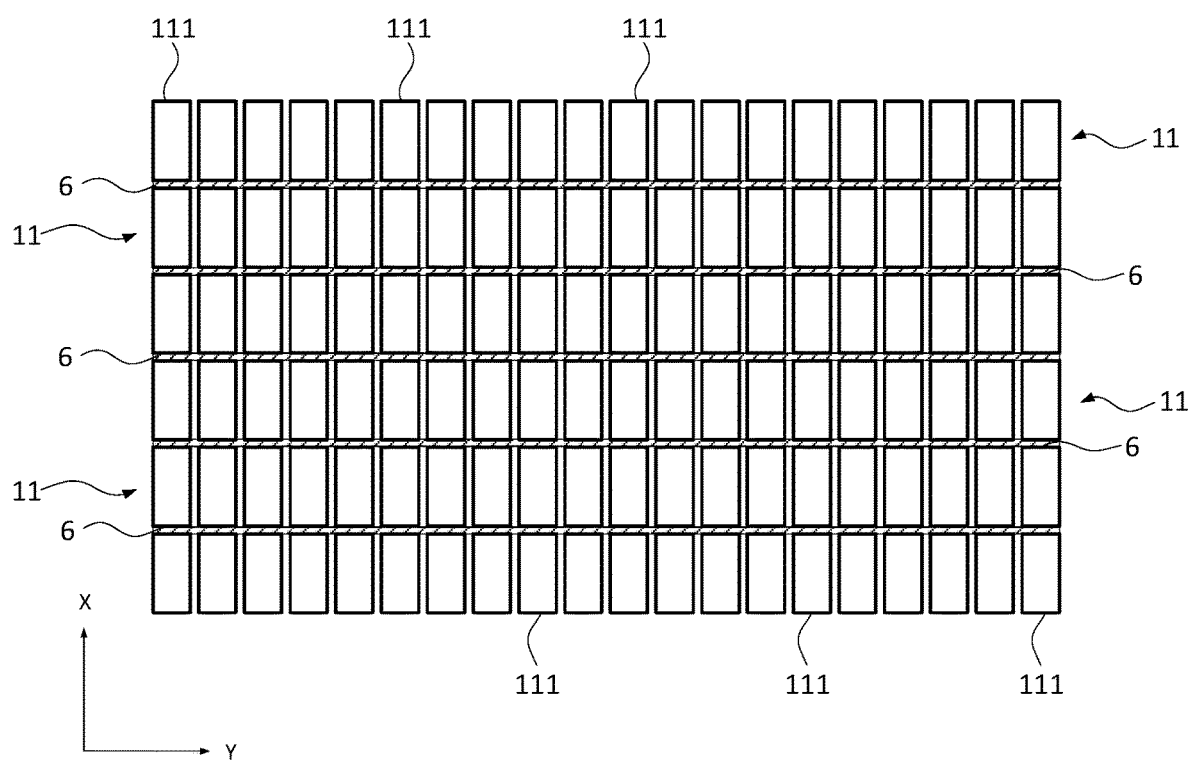
FIG. 13 is a third top view of the photovoltaic cell pack.

The dimension of the limiting member 6 in the length direction Y of the photovoltaic module (a length of the limiting member 6) is not limited. As shown in FIG. 13, the length of the limiting member 6 may be equal to a dimension of the solar cell string 11 along the length direction Y of the photovoltaic module (i.e., a length of the solar cell string 11).

Figure 8:
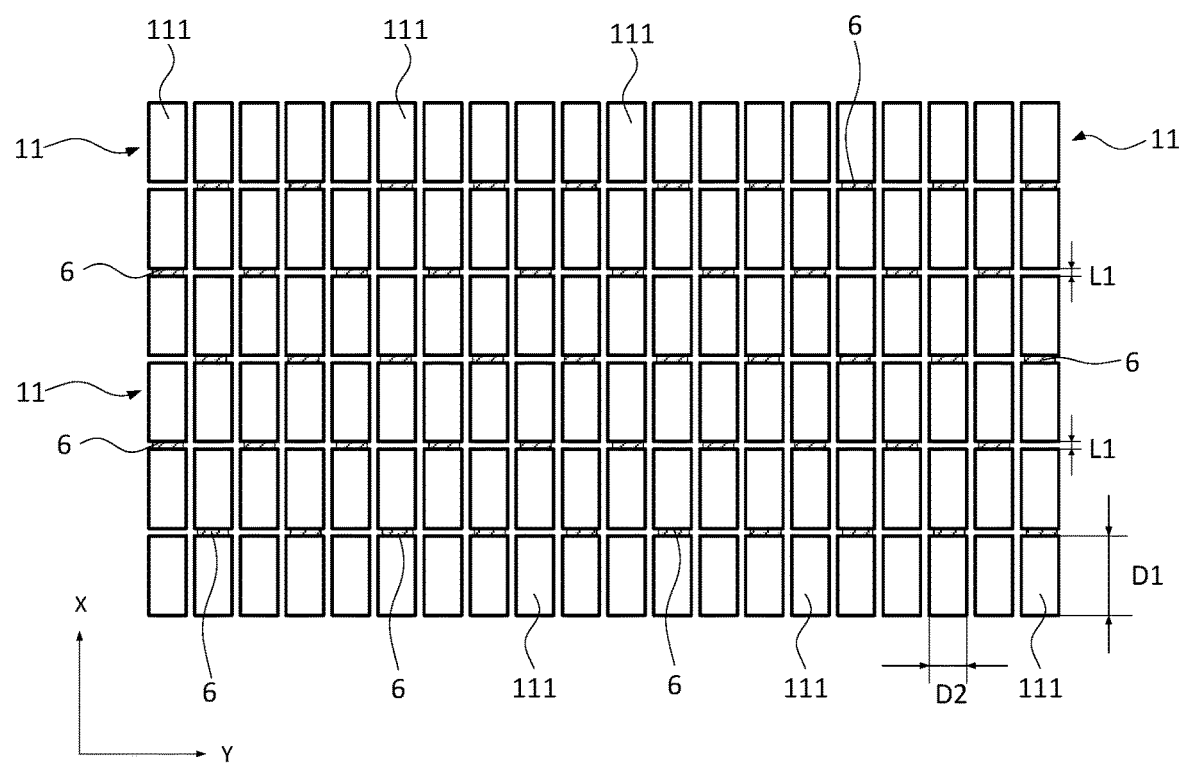
FIG. 8 is a second top view of the photovoltaic cell pack.

In some other embodiments, the length of the limiting member 6 may be less than the length of the solar cell string 11. In this case, limiting members 6 may be arranged between two adjacent solar cell strings 11, and the limiting members 6 are spaced apart along the length direction Y of the photovoltaic module. For example, as shown in FIG. 2 and FIG. 8, when the length of the limiting member 6 is less than or equal to a dimension D2 of the solar cell 111 in the length direction Y of the photovoltaic module, the limiting member 6 may be arranged in the photovoltaic module in the following two manners. As shown in FIG. 2, along the width direction X of the photovoltaic module, the limiting members 6 are located between a $2n-1^{th}$ solar cell 111 of a $2n-1^{th}$ solar cell string 11 in the length direction Y of the photovoltaic module and a $2n-1^{th}$ solar cell 111 of a $2n^{th}$ solar cell string 11 in the length direction Y of the photovoltaic module and located between a $2n^{th}$ solar cell 111 of the $2n^{th}$ solar cell string 11 in the length direction Y of the photovoltaic module and a $2n^{th}$ solar cell 111 of a $2n+1^{th}$ solar cell string 11 in the length direction Y of the photovoltaic module, where $n≥1$.

For example, n=1. Along the width direction X of the photovoltaic module, the limiting members 6 are located between the first solar cell 111 of the first solar cell string 11 in the length direction Y of the photovoltaic module and the first solar cell 111 of the second solar cell string 11 in the length direction Y of the photovoltaic module, and the limiting members 6 are also located between the second solar cell 111 of the second solar cell string 11 in the length direction Y of the photovoltaic module and the second solar cell 111 of the third solar cell string 11 in the length direction Y of the photovoltaic module. That is, along the width direction X of the photovoltaic module and the length direction Y of the photovoltaic module, the limiting members 6 are spaced apart, and for a same solar cell 111, at most one of two sides along the width direction X of the photovoltaic module is provided with the limiting member 6.

In some other embodiments, as shown in FIG. 8, along the width direction X of the photovoltaic module, the limiting members 6 are located between a $2n^{th}$ solar cell 111 of a $2n-1^{th}$ solar cell string 11 in the length direction Y of the photovoltaic module and a $2n^{th}$ solar cell 111 of a $2n^{th}$ solar cell string 11 in the length direction Y of the photovoltaic module and located between a $2n-1^{th}$ solar cell 111 of the $2n^{th}$ solar cell string 11 in the length direction Y of the photovoltaic module and a $2n-1^{th}$ solar cell 111 of a $2n+1^{th}$ solar cell string 11 in the length direction Y of the photovoltaic module, where $n≥1$.

For example, n=1. Along the width direction X of the photovoltaic module, the limiting members 6 are located between the second solar cell 111 of the first solar cell string 11 in the length direction Y of the photovoltaic module and the second solar cell 111 of the second solar cell string 11 in the length direction Y of the photovoltaic module, and the limiting members 6 are also located between the first solar cell 111 of the second solar cell string 11 in the length direction Y of the photovoltaic module and the first solar cell 111 of the third solar cell string 11 in the length direction Y of the photovoltaic module. That is, along the width direction X of the photovoltaic module and the length direction Y of the photovoltaic module, the limiting members 6 are spaced apart, and for a same solar cell 111, at most one of two sides along the width direction X of the photovoltaic module is provided with the limiting member 6.

Through the above two arrangement and placement, raw materials can be saved on the premise of ensuring that the effect of the limiting member 6 is not affected, so as to reduce the cost of the photovoltaic module.

Figure 14:
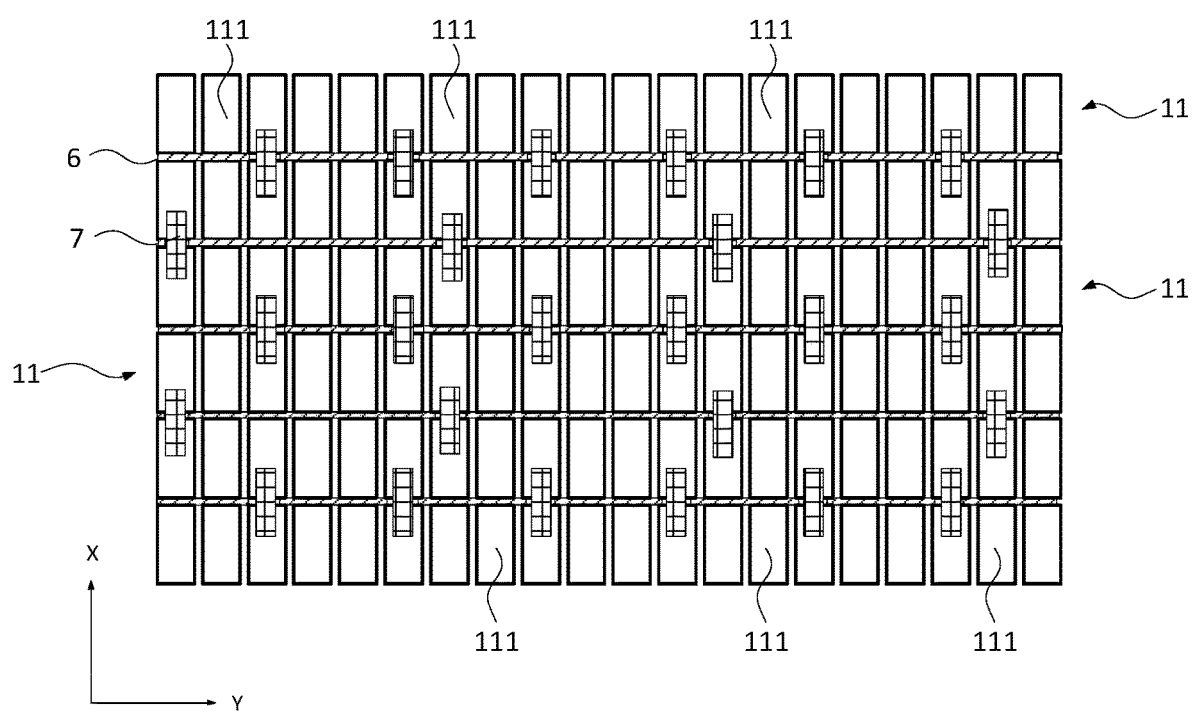
FIG. 14 is a fourth top view of the photovoltaic cell pack.

As shown in FIG. 14, the photovoltaic module further includes a positioning tape 7. The positioning tape 7 can connect the solar cells 111 of two adjacent solar cell strings 11 (i.e., two adjacent solar cells 111 in the width direction X of the photovoltaic module) and can limit the solar cells 111, which can play a same role of preventing the displacement of the solar cell string 11 as the limiting member 6. For example, two ends of the positioning tape 7 are respectively bonded to the solar cells 111 of the two adjacent solar cell strings 11 along the width direction X of the photovoltaic module. Moreover, a plurality of positioning tapes 7 are spaced apart along the length direction Y of the photovoltaic module.

Specific shapes and sizes of the positioning tapes 7 and a distance between two adjacent positioning tapes are not limited in this embodiment.

In this case, the limiting member 6 may be arranged according to the position of the positioning tape 7, provided that they do not overlap along the length direction Y of the photovoltaic module. A specific number of the limiting member 6 and a length thereof may be adjusted according to the position of the positioning tape 7, which are not limited in this embodiment.

In addition, during the lamination of the photovoltaic module, the solar cell string 11 and the limiting member 6 may be displaced, such that part of the solar cell 111 moves toward an outer side of the photovoltaic module along the width direction X of the photovoltaic module, resulting in a gap ranging from 0.3 mm to 0.7 mm between the solar cell 111 not affixed with the positioning tape 7 and the limiting member 6 adjacent thereto, while the solar cell 111 affixed with the positioning tape 7 may not move since the positioning tape 7 has a good fixing effect on the solar cell 111.

As shown in FIG. 8, along the width direction X of the photovoltaic module, the solar cell 111 has a first dimension D1, and along the length direction Y of the photovoltaic module, the solar cell 111 has a second dimension D2. In conventional technical means, two slices (i.e., D2=½D1), three slices (i.e., D2=⅓D1), or fourth slices (i.e., D2=¼D1) are commonly used as the solar cell 111. In a conventional photovoltaic cell pack 1, a number of the solar cell string 11 is 6, a distance between adjacent solar cells 111 is 1.9 mm, and the first dimension D1 of the solar cell 111 ranges from 163 mm to 210 mm, and is 163 mm, 182 mm, or 210 mm in some embodiments.

It is to be noted that various embodiments in the present disclosure are described based on an example in which the solar cell 111 is two slices, but the solar cell may be three slices or four slices, which is not limited in the present disclosure.

When the photovoltaic module adopts the above structure with the limiting member 6, the distance L1 between adjacent solar cell strings 11 can be reduced, thereby increasing the first dimension D1, which helps to increase power of the photovoltaic module.

For example, the photovoltaic cell pack 1 includes 6 solar cell strings 11 arranged side by side and the distance L1 between adjacent solar cell strings 11 ranges from 0.3 mm to 1.5 mm. An increased value range of the first dimension D1 of the solar cell 111 in each solar cell string 11 may be calculated according to [5×(1.9−L1)]/6, where 5 denotes that there are 5 distances L1 in the photovoltaic cell pack when the 6 solar cell strings 11 are arranged side by side. Therefore, when the number of the solar cell strings 11 in the photovoltaic cell pack 1 is n, there are n−1 distances L1 in the photovoltaic cell pack 1, and an increased value of the first dimension D1 may be calculated by using a formula [(n−1)×(1.9−L1)]/n.

When the solar cell 111 is two slices and the first dimension D1 is 163 mm, the second dimension D2 is 81.5 mm. It may be calculated according to the above formula that the increased value range (decimal places rounded to 0.5 mm) of the first dimension D1 ranges from 0.5 mm to 1.5 mm. Therefore, when the first dimension D1 of the solar cell 111 is originally 163 mm, an increased first dimension D1 ranges from 163.5 mm to 164.5 mm, which may be, for example, 163.5 mm, 163.7 mm, 163.9 mm, 164.1 mm, 164.3 mm, or 164.5 mm, and the second dimension D2 of the solar cell 111 remains unchanged at 81.5 mm. When the first dimension D1 of the solar cell 111 is originally 182 mm, an increased first dimension D1 ranges from 182.5 mm to 183.5 mm, which may be, for example, 182.5 mm, 182.7 mm, 182.9 mm, 183.1 mm, 183.3 mm, or 183.5 mm, or may be other values in the above range, and the second dimension D2 of the solar cell 111 remains unchanged at 91 mm. When the first dimension D1 of the solar cell 111 is originally 210 mm, an increased first dimension D1 ranges from 210.5 mm to 211.5 mm, which may be, for example, 210.5 mm, 210.7 mm, 210.9 mm, 211.1 mm, 211.3 mm, or 211.5 mm, or may be other values in the above range, and the second dimension D2 of the solar cell 111 remains unchanged at 105 mm.

According to the above calculation, it can be seen that, when the solar cell 111 is originally two slices and the first dimension D1 ranges from 163 mm to 210 mm, an increased first dimension D1 ranges from 163.5 mm to 211.5 mm, which may be, for example, 163.5 mm, 170 mm, 182 mm, 190 mm, 200 mm, 210 mm, or 211.5 mm, and D1:D2 satisfies: 2<D1:D2≤2.02, which may be, for example, 2.001, 2.006, 2.012, 2.015, or 2.02, or may be other values in the above range, and is not limited in this embodiment.

Similarly, when the solar cell 111 is three slices and the first dimension D1 ranges from 163 mm to 210 mm, an increased first dimension D1 ranges from 163.5 mm to 211.5 mm, and D1:D2 satisfies: 3.01≤D1:D2≤3.03, which may be, for example, 3.01, 3.016, 3.023, 3.025, or 3.03, or may be other values in the above range, and is not limited in this embodiment.

Similarly, when the solar cell 111 is four slices and the first dimension D1 ranges from 163 mm to 210 mm, an increased first dimension D1 ranges from 163.5 mm to 211.5 mm, and D1:D2 satisfies: 4.01≤D1:D2≤4.04, which may be, for example, 4.01, 4.016, 4.022, 4.036, or 4.04, or may be other values in the above range, and is not limited in this embodiment.

As shown in FIG. 3, along the height direction Z of the photovoltaic module, a thickness H2 of the solar cell 111 ranges from 100 μm to 250 μm, which may be, for example, 100 μm, 120 μm, 140 μm, 160 μm, 180 μm, 200 μm, 230 μm, or 250 μm, or may be other values in the above range, and is not limited herein. In some embodiments, the thickness H2 of the solar cell 111 ranges from 130 μm to 180 μm. Within the range of the thickness, the thickness of the solar cell 111 is small, such that an overall weight of the solar cell 111 can be reduced, which is beneficial to realize a light weight of the photovoltaic module.

The structure of the solar cell 111 is not limited in the present disclosure. Types of the solar cell 111 include, but are not limited to, a passivated emitter and rear contact (PERC) solar cell, a tunnel oxide passivated contact (TOPCon) solar cell, a heterojunction (HJT) solar cell, an interdigitated back contact (IBC) solar cell, and the like.

For the PERC solar cell, along a thickness direction thereof, the PERC solar cell sequentially includes a front-surface metal silver electrode, a front-surface silicon nitride passivation layer, a phosphor layer emitter, a P-type substrate silicon layer, a local aluminum back field, a metal aluminum back electrode, and a back passivation layer ($Al_2O_3/SiN_x$). In the PERC solar cell, a passivation film is used to passivate the back to replace an all-aluminum back field, which enhances internal back reflection of light on a silicon substrate, reduces a recombination rate on the back, and increases efficiency of the solar cell by 0.5% to 1%.

For the TOPCon solar cell, along a thickness direction thereof, the TOPCon solar cell sequentially includes a metal silver electrode, a front-surface silicon nitride passivation layer, a boron-doped emitter, an N-type substrate silicon layer, a diffusion doping layer, ultra-thin silicon oxide, doped polysilicon, silicon nitride, and a metal silver electrode. The back of the solar cell is formed by a layer of ultra-thin silicon oxide (1 nm to 2 nm) and a layer of phosphorus-doped microcrystalline amorphous mixed Si film, which jointly form a passivated contact structure. The structure may prevent recombinations of minority carriers and holes, and increase an open-circuit voltage and a short-circuit current of the solar cell. The ultra-thin oxide layer may block the recombinations of the minority electrons and holes while allowing many electrons to tunnel into a polysilicon layer. A good passivation effect of the ultra-thin silicon oxide and a heavily doped silicon film causes a surface energy band of a silicon wafer to bend, so as to form a field passivation effect, which greatly increases a probability of electron tunneling, reduces contact resistance, and improves the open-circuit voltage and the short-circuit current of the solar cell, thereby improving conversion efficiency of the solar cell.

For the HJT solar cell, along a thickness direction thereof, the HJT solar cell sequentially includes a front low-temperature silver electrode, a front conductive film, an N-type amorphous silicon film, an intrinsic amorphous silicon film, an N-type substrate silicon layer, an intrinsic amorphous silicon film, a P-type amorphous silicon film, a back conductive film, and a back low-temperature silver electrode.

For the IBC solar cell, along a thickness direction thereof, the IBC solar cell sequentially includes a silicon nitride anti-layer, an N+ front surface field, an N-type substrate silicon layer, a P+ emitter, an N+ back field, an aluminum oxide passivation layer, a silicon nitride anti-reflection layer, and a metal silver electrode. The IBC solar cell can obtain P and N regions with good uniformity and precise and controllable junction depths by using an ion implantation technology, and there is no electrode on the front of the solar cell, which can eliminate a blackout current loss of a metal electrode, realize maximum utilization of incident photons, and increase the short-circuit current by about 7% compared with conventional solar cells. Due to a back contact structure, there is no need to consider the shielding of the electrode, and a proportion of the electrode can be appropriately widened, thereby reducing series resistance and having a high fill factor. Surface passivation and a surface light trapping structure can be optimally designed to obtain a lower front surface recombination rate and surface reflection.

The solar cell 111 may adopt a multi-busbar solution, which can shorten a current conduction path and reduce internal losses, thereby increasing the power of the photovoltaic module and reducing the cost of the photovoltaic module. In some other embodiments, a busbar-free solution may be adopted, a solder strip replaces an original busbar and is directly connected to a finger, which can greatly reduce consumption of silver paste, thereby reducing the cost of the photovoltaic module.

Figure 9:
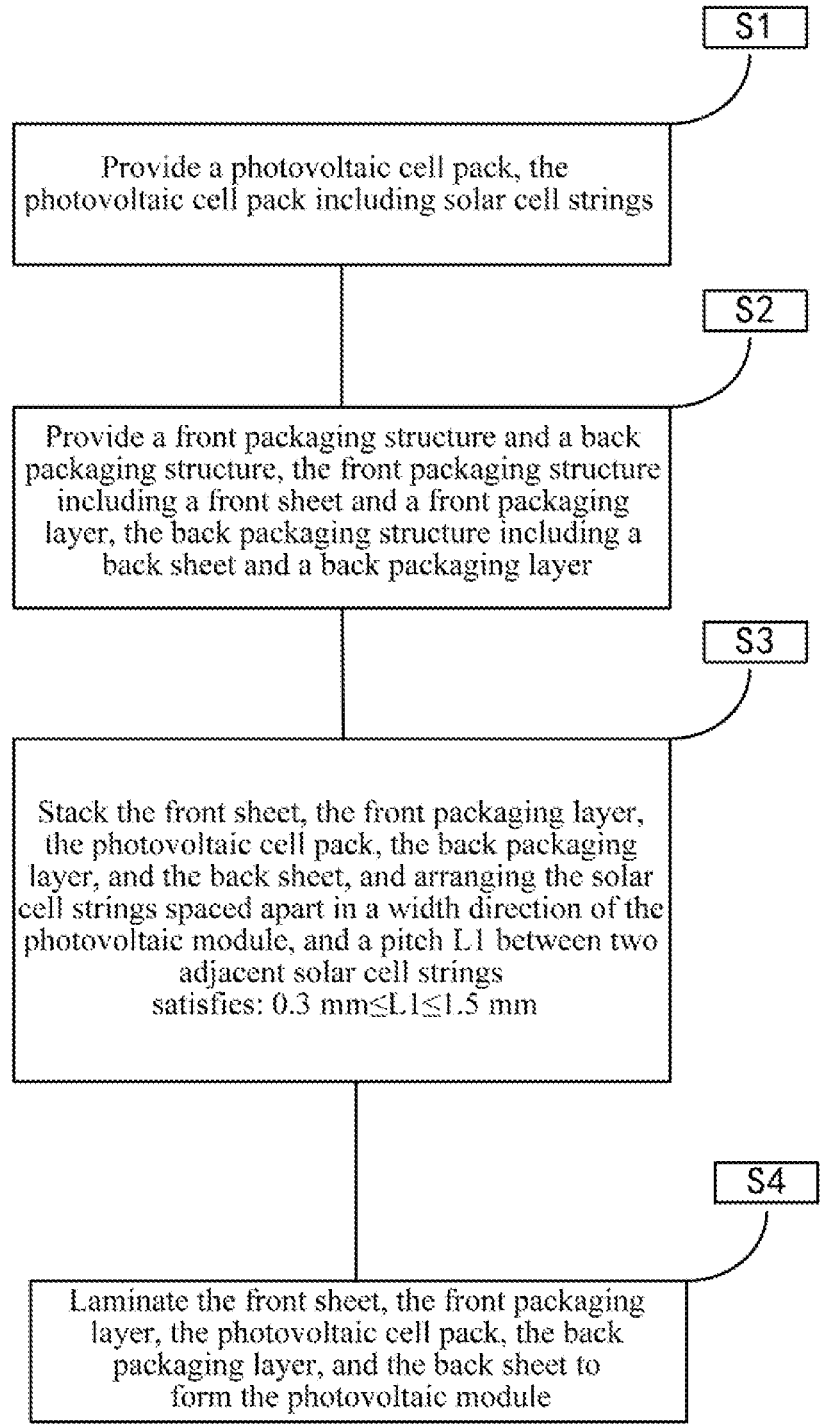
FIG. 9 is a flowchart of manufacturing the photovoltaic module according to the present disclosure.

The present disclosure further provides a method for a photovoltaic module is provided. As shown in FIG. 9, the method includes the following steps.

In step S1, a photovoltaic cell pack 1 is provided, the photovoltaic cell pack 1 including solar cell strings 11.

Each solar cell string 11 is formed by a plurality of solar cells 111 connected in series along a length direction Y of the photovoltaic module.

In step S2, a front packaging structure and a back packaging structure are provided, the front packaging structure including a front sheet 2 and a front packaging layer 3, the back packaging structure including a back sheet 4 and a back packaging layer 5.

The front sheet 2 and the back sheet 4 may be made of one of the following rigid materials: tempered glass, PET and PC, or made of one of the following flexible materials: Polyvinyl Fluoride (PVF), Ethylene-Tetra-Fluoro-Ethylene (ETFE), and Polyvinylidene Fluoride (PVDF). The front packaging layer 3 and the back packaging layer 5 are adhesive films. The adhesive film may be made of one of the following materials: an EVA, a POE, and PVB. In some other embodiments, the front packaging layer 3 and the back packaging layer 5 may be an EPE adhesive film (an EVA-POE-EVA co-extrusion structure) or an EP adhesive film (an EVA-EP co-extrusion structure).

In step S3, the front sheet 2, the front packaging layer 3, the photovoltaic cell pack 1, the back packaging layer 5, and the back sheet 4 are stacked, and the solar cell strings 11 are spaced apart in a width direction X of the photovoltaic module, wherein a distance L1 between two adjacent solar cell strings 11 satisfies: $0.3 \text{ mm} \le L1 \le 1.5 \text{ mm}$.

There are two stacking orders. The first one is to first place the front sheet 2 on a platform, and then sequentially place the front packaging layer 3, the photovoltaic cell pack 1, the back packaging layer 5, and the back sheet 4, which are assembled into the photovoltaic module. The second one is to first place the back sheet 4 on a platform, and then sequentially place the back packaging layer 5, the photovoltaic cell pack 1, the front packaging layer 3, and the front sheet 2.

No matter which order is adopted, it should be ensured that the distance L1 between two adjacent solar cell strings 11 ranges from 0.3 mm to 1.5 mm, which may be, for example, 0.3 mm, 0.4 mm, 0.5 mm, 0.6 mm, 0.7 mm, 0.8 mm, 0.9 mm, 1 mm, 1.1 mm, 1.2 mm, 1.3 mm, 1.4 mm, or 1.5 mm, or may be other values in the above range, and is not limited herein. When the distance L1 between two adjacent solar cell strings 11 ranges from 0.3 mm to 1.5 mm, the dimension of the solar cell 111 in the width direction X of the photovoltaic module can be increased, which helps to improve photoelectric conversion efficiency of the photovoltaic module, and at the same time, can prevent short-circuiting of the photovoltaic module caused by contact between the two adjacent solar cell strings 11 during the lamination, thereby helping to increase a yield of the photovoltaic module.

In step S4, the front sheet 2, the front packaging layer 3, the photovoltaic cell pack 1, the back packaging layer 5, and the back sheet 4 are laminated to form the photovoltaic module.

Lamination is to bond and fuse various components of the photovoltaic module together under a temperature, pressure, and a vacuum condition, so as to protect the photovoltaic cell pack 1. The photovoltaic module after the stacking is placed in a laminator, the air in the photovoltaic module is drawn out by vacuuming, then heating is carried out to melt and cure the front packaging layer 3 and the back packaging layer 5 and bond the photovoltaic cell pack 1, the front sheet 2, and the back sheet 4 together, and finally the photovoltaic module is cooled and taken out.

According to the method for a photovoltaic module in the present disclosure, the distance L1 between adjacent solar cell strings 11 is limited to a range from 0.3 mm to 1.5 mm in the stacking step, such that, when the width of the photovoltaic module is constant, a reduced string distance can be compensated for the size of the solar cell 111, and a dimension of the solar cell 111 along the width direction X of the photovoltaic module can be increased. A blank area of layout of the photovoltaic module can be reduced, and a light-receiving area of the photovoltaic cell pack per unit area is increased, thereby increasing power generation per unit area of the photovoltaic module and then improving the photoelectric conversion efficiency of the photovoltaic module.

In one or more embodiments, for step S3, the method includes: arranging a limiting member 6 between two adjacent solar cell strings 11, and clamping at least part of a main body portion 61 of the limiting member 6 between the two adjacent solar cell strings 11.

When the photovoltaic cell pack 1 is placed in the stacking step, the limiting member 6 is placed between two adjacent solar cell strings 11, such that the two adjacent solar cell strings 11 jointly clamp the main body portion 61 of the limiting member 6 along the width direction X of the photovoltaic module. After the limiting member 6 is placed, an edge of a contact portion between the limiting member 6 and the solar cell 111 may be preheated to melt an edge of the limiting member 6 to realize pre-fixing of the limiting member 6 and the solar cell 111.

When the limiting member 6 is arranged between two adjacent solar cell strings 11, the method includes: placing the solar cell strings 11 and the limiting member 6 sequentially along the width direction X of the photovoltaic module.

When the solar cell strings 11 and the limiting member 6 are placed, there is a need to ensure that the limit member 6 is arranged between each two solar cell strings 11 in the width direction X of the photovoltaic module.

As shown in FIG. 1, along the width direction X of the photovoltaic module, there is a certain distance between the solar cell strings 11 located at two ends of the photovoltaic cell pack 1 and an edge of the front sheet 2 and/or the back sheet 4, and the front packaging layer 3 and the back packaging layer 5 that are laminated can fill the position, so as to package a side surface of the photovoltaic cell pack 1. Therefore, two sides of the photovoltaic cell pack 1 along the width direction X of the photovoltaic module may not be provided with the limiting member 6.

If the first stacking order is adopted for the photovoltaic module, in the above method for arranging the solar cell strings 11 and the limiting member 6, the solar cell strings 11 and the limiting member 6 are arranged on a side surface of the front packaging layer 3 away from the front sheet 2.

If the second stacking order is adopted for the photovoltaic module, in the above method for arranging the solar cell strings 11 and the limiting member 6, the solar cell strings 11 and the limiting member 6 are arranged on a side surface of the back packaging layer 5 away from the back sheet 4.

Figure 10:
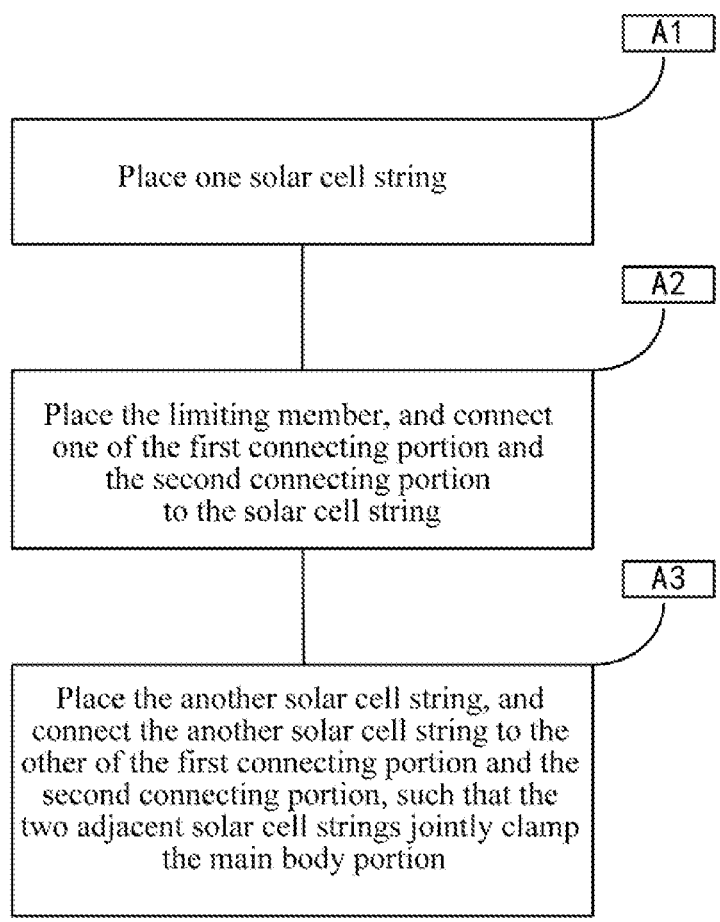
FIG. 10 is a flowchart of manufacturing the photovoltaic module according to the present disclosure.

In one or more embodiments, the limiting member 6 further includes a first connecting portion 62 and a second connecting portion 63, the first connecting portion 62 and the second connecting portion 63 are fixedly connected to two ends of the main body portion 61 along a height direction Z of the photovoltaic module, and a cross-section shape of the limiting member 6 is Z-shaped. In this case, when the solar cell strings 11 and the limiting member 6 are placed sequentially along the width direction X of the photovoltaic module, as shown in FIG. 10, the method includes the following steps.

In step A1, one solar cell string 11 is placed.

In step A2, the limiting member 6 is placed, and one of the first connecting portion 62 and the second connecting portion 63 is connected to the solar cell string 11.

In step A3, the other solar cell string 11 is placed, and the solar cell string 11 is connected to the other of the first connecting portion 62 and the second connecting portion 63, such that the two adjacent solar cell strings 11 jointly clamp the main body portion 61.

In this case, the second solar cell string 11 can limit movement in the width direction X of the photovoltaic module, realizing mounting and fixation of the limiting member 6.

It is to be noted that, along the height direction Z of the photovoltaic module, a surface of the first connecting portion 62 close to the front packaging layer 3 is an upper surface thereof, and a surface away from the front packaging layer 3 is a lower surface thereof. Along the height direction Z of the photovoltaic module, a surface of the second connecting portion 63 close to the back packaging layer 5 is a lower surface thereof, and a surface away from the back packaging layer 5 is an upper surface thereof.

If the first stacking order is adopted for the photovoltaic module, in the above method for arranging the solar cell strings 11 and the limiting member 6, one solar cell string 11 is first placed on a side surface of the front packaging layer 3 away from the front sheet 2, then the limiting member 6 is placed, the upper surface of the second connecting portion 63 is connected to a backlight surface of the solar cell string 11, then the other solar cell string 11 is placed, a light-facing surface of the solar cell string 11 is connected to the lower surface of the first connecting portion 62, and then the above steps are repeated to mount the remaining solar cell strings 11 and limiting members 6. If the second stacking order is adopted for the photovoltaic module, in the above method for arranging the solar cell strings 11 and the limiting member 6, one solar cell string 11 is first placed on a side surface of the back packaging layer 5 away from the back sheet 4, then the limiting member 6 is placed, the lower surface of the first connecting portion 62 is connected to a light-facing surface of the solar cell string 11, then the other solar cell string 11 is placed, a backlight surface of the solar cell string 11 is connected to the upper surface of the second connecting portion 63, and then the above steps are repeated to mount the remaining solar cell strings 11 and limiting members 6.

Figure 11:
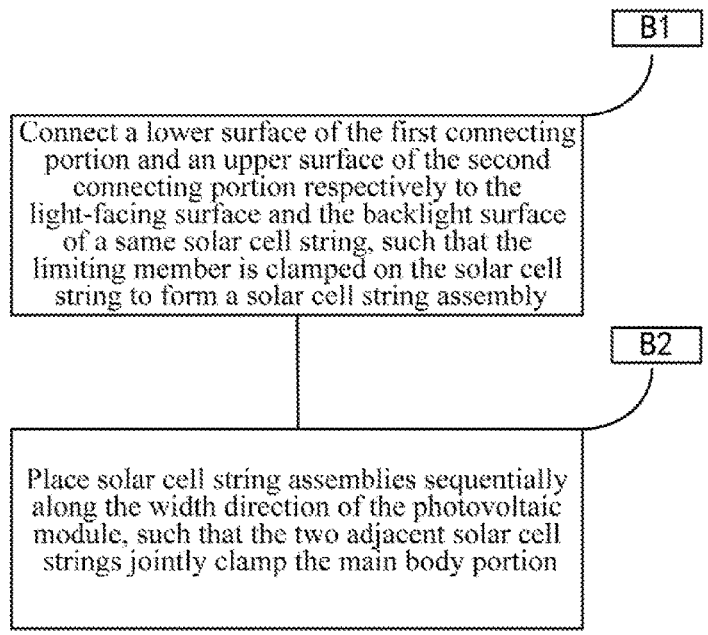
FIG. 11 is a flowchart of manufacturing the photovoltaic module according to the present disclosure.

In some other embodiments, the limiting member 6 further includes a first connecting portion 62 and a second connecting portion 63, the first connecting portion 62 and the second connecting portion 63 are fixedly connected to two ends of the main body portion 61 along a height direction Z of the photovoltaic module, and a cross-section shape of the limiting member 6 is C-shaped. In this case, when the limiting member 6 is arranged between two adjacent solar cell strings 11, as shown in FIG. 11, the method includes the following steps.

In step B1, a lower surface of the first connecting portion 62 and an upper surface of the second connecting portion 63 are respectively connected to the light-facing surface and the backlight surface of a same solar cell string 11, such that the limiting member 6 is clamped on the solar cell string 11 to form a solar cell string assembly.

The limiting member 6 is first clamped on the solar cell string 11, which can realize a stable connection between the limiting member 6 and the solar cell string 11, improve mounting stability of the limiting member 6, prevent displacement of the limiting member 6, and help to improve an isolation effect of the limiting member 6 on two adjacent solar cell strings 11.

In step B2, a plurality of solar cell string assemblies are placed sequentially along the width direction X of the photovoltaic module, such that the two adjacent solar cell strings 11 jointly clamp the main body portion 61.

The limiting member 6 and the solar cell strings 11 are placed in the form of solar cell string assemblies, which, compared with the manner of sequentially placing the two, a position relationship between the limiting member 6 and the solar cell strings 11 can be preset without adjusting the position of the limiting member 6 during the stacking, which improves manufacturing efficiency of the photovoltaic module.

If the first stacking order is adopted for the photovoltaic module, in the above method, the solar cell string assemblies are arranged on a side surface of the front packaging layer 3 away from the front sheet 2. If the second stacking order is adopted for the photovoltaic module, in the above method, the solar cell string assemblies are arranged on a side surface of the back packaging layer 5 away from the back sheet 4. In some other embodiments, the limiting members 6 and the front packaging layer 3 are integrally formed, at least one of the limiting members 6 and the front packaging layer 3 define an accommodation space, and when the limiting member 6 is arranged between two adjacent solar cell strings 11, the method includes: accommodating the solar cell strings 11 in the accommodation space, such that the two adjacent solar cell strings 11 jointly clamp the main body portion 61.

If the first stacking order is adopted for the photovoltaic module, in the above method, the solar cell string 11 is placed on a side surface of the front packaging layer 3 provided with the limiting member 6, and the solar cell string 11 should be accommodated in the accommodation space. If the second stacking order is adopted for the photovoltaic module, in the above method, the solar cell strings 11 are firstly placed apart on a side surface of the back packaging layer 5 away from the back sheet 4, and then a side surface of the front packaging layer 3 provided with the limiting member 6 is laid towards the photovoltaic cell pack 1. In this process, it should be noted that the limiting member 6 and the two adjacent solar cell strings 11 is aligned along the height direction Z of the photovoltaic module, such that the solar cell strings 11 can be accommodated in the accommodation space.

In some other embodiments, the limiting members 6 and the back packaging layer are integrally formed, at least one of the limiting members 6 and the back packaging layer 5 define an accommodation space, and when the limiting member 6 is arranged between two adjacent solar cell strings 11, the method includes: accommodating the solar cell strings 11 in the accommodation space, such that the two adjacent solar cell strings 11 jointly clamp the main body portion 61.

If the first stacking order is adopted for the photovoltaic module, in the above method, the solar cell strings 11 are firstly placed apart on a side surface of the front packaging layer 3 away from the front sheet 2, and then a side surface of the back packaging layer 5 provided with the limiting member 6 is laid towards the photovoltaic cell pack 1. In this process, it should be noted that the limiting member 6 and the two adjacent solar cell strings 11 is aligned along the height direction Z of the photovoltaic module, such that the solar cell strings 11 can be accommodated in the accommodation space. If the second stacking order is adopted for the photovoltaic module, in the above method, the solar cell string 11 is placed on a side surface of the back packaging layer 5 provided with the limiting member 6, and the solar cell string 11 should be accommodated in the accommodation space.

In one or more embodiments, before the limiting member 6 is arranged between two adjacent solar cell strings 11, the method further includes: arranging a positioning tape 7 on the two adjacent solar cell strings 11, two ends of the positioning tape 7 are respectively bonded to the two adjacent solar cell strings 11 along the width direction X of the photovoltaic module; or after the limiting member 6 is arranged between two adjacent solar cell strings 11, the method further includes: arranging a positioning tape 7 on the two adjacent solar cell strings 11, two ends of the positioning tape 7 are respectively bonded to the two adjacent solar cell strings 11 along the width direction X of the photovoltaic module.

If the structure of the limiting member 6, as shown in FIG. 3, includes only the main body portion 61 but does not include the first connecting portion 62 and the second connecting portion 63, during the stacking, two solar cell strings 11 are first placed, the positioning tape 7 is affixed between the two solar cell strings 11, the limiting member 6 is inserted between the two adjacent solar cell strings 11 that have been fixed by the positioning tape 7, then another solar cell string 11 is continuously placed such that one of the two solar cell strings 11 placed just now is connected to the solar cell string 11 through the positioning tape 7, and then the limiting member 6 is continuously inserted between the two.

If the cross-section shape of the limiting member 6 is C-shaped, Z-shaped, or I-shaped, or the limiting member 6 and the front packaging layer 3 and/or the back packaging layer 5 are integrally formed, the positioning tape 7 may be affixed after the solar cell string 11 and the limiting member 6 are placed. In some embodiments, the two solar cell strings 11 and the limiting member 6 are first connected, the positioning tape 7 is affixed to the two solar cell strings 11, and then the remaining solar cell strings 11 are placed and connected one by one in this order. That is, the positioning tape 7 is affixed after each two solar cell strings 11 are placed and the limiting member 6 is arranged.

According to the stacking order of the photovoltaic module, the positioning tape 7 may be selectively affixed to the light-facing surface or the backlight surface of the solar cell 111. For example, when the limiting member 6 has the structure shown in FIG. 3 and the first stacking order is adopted, the solar cell 111 is first placed on the front packaging layer 3, such that the light-facing surface thereof is first bonded to the front packaging layer 3. In this case, the positioning tape 7 may be affixed to the backlight surface of the solar cell 111. When the limiting member 6 has the structure shown in FIG. 3 and the second stacking order is adopted, the solar cell 111 is first placed on the back packaging layer 5, such that the backlight surface thereof is first bonded to the back packaging layer 5. In this case, the positioning tape 7 may be affixed to the light-facing surface of the solar cell 111. When the limiting member 6 has another structure, the positioning tape 7 is arranged in a similar manner.

In order to reduce an influence on the power of the photovoltaic module, the positioning tape 7 is affixed to the backlight surface of the solar cell 111.

It is to be noted that the data involved in the above embodiments are all allowed to have an error value ranging from 5% to 10%, which may not affect the technical effect of the present disclosure.

The above are only preferred embodiments of the present disclosure and are not intended to limit the present disclosure. For those skilled in the art, the present disclosure may have various modifications and variations. Any modifications, equivalent substitutions, improvements and the like made within the spirit and principle of the present disclosure should fall within the protection scope of the present disclosure.

What is claimed is:

1. A photovoltaic module comprising:
a photovoltaic cell pack (1), comprising solar cell strings (11) spaced apart along a width direction of the photovoltaic module;
a front packaging structure, arranged on a light-facing surface of the photovoltaic cell pack (1), and comprising a front sheet (2) and a front packaging layer (3); and
a back packaging structure, arranged on a backlight surface of the photovoltaic cell pack (1), and comprising a back sheet (4) and a back packaging layer (5), wherein the back sheet (4) and the front sheet (2) jointly clamp the front packaging layer (3), the photovoltaic cell pack (1), and the back packaging layer (5),
wherein a distance L1 between two adjacent solar cell strings (11) along the width direction of the photovoltaic module satisfies: 0.3 mm≤L1≤1.5 mm;
wherein the photovoltaic module further comprises limiting members (6), and each of the limiting members (6) is located between two adjacent solar cell strings (11); and
wherein each of the limiting members (6) comprises a main body portion (61), and at least part of the main body portion (61) is clamped between the two adjacent solar cell strings (11);
wherein a height H1 of each of the limiting members (6) along a height direction of the photovoltaic module satisfies: 1 mm≤H1≤2.3 mm;
wherein the limiting members (6) and the front packaging layer (3) are integrally formed, at least one of the limiting members (6) and the front packaging layer (3) define an accommodation space, and one solar cell string of the solar cell strings (11) is located in the accommodation space;
and/or the limiting members (6) and the back packaging layer (5) are integrally formed, and at least one of the limiting members (6) and the back packaging layer (5) define an accommodation space, and one solar cell string of the solar cell strings (11) is located in the accommodation space;
wherein at least two limiting members (6) of the limiting members (6) are arranged between two adjacent solar cell strings (11), and the at least two limiting members (6) are spaced apart along a length direction of the photovoltaic module at least for a width of one cell provided in one of the solar cell strings (11).

2. The photovoltaic module according to claim 1, wherein the limiting members (6) are made of an insulating material; and
the limiting members (6) are made of one of an adhesive film, transparent glass, a cured insulating adhesive, a transparent plastic plate, and transparent rubber.

3. The photovoltaic module according to claim 1, wherein each of the limiting members (6) further comprises a first connecting portion (62) and a second connecting portion (63), and the first connecting portion (62) and the second connecting portion (63) are fixedly connected to two ends of the main body portion (61) along a height direction of the photovoltaic module; and
an upper surface of the first connecting portion (62) is connected to the front packaging layer (3), and a lower surface of the second connecting portion (63) is connected to the back packaging layer (5).

4. The photovoltaic module according to claim 3, wherein a cross-section of each of the limiting members (6) is Z-shaped; and
a lower surface of the first connecting portion (62) is connected to the light-facing surface of a corresponding solar cell string (11) of the solar cell strings (11), and an upper surface of the second connecting portion (63) is connected to the backlight surface of another solar cell string (11) of the solar cell strings (11) adjacent to the corresponding solar cell string (11).

5. The photovoltaic module according to claim 3, wherein a cross-section of each of the limiting members (6) is C-shaped; and
a lower surface of the first connecting portion (62) and an upper surface of the second connecting portion (63) are respectively connected to the light-facing surface and the backlight surface of a same solar cell string (11).

6. The photovoltaic module according to claim 1, wherein each of the solar cell strings (11) comprises solar cells (111) arranged along a length direction of the photovoltaic module, and each of the solar cells (111) has a first dimension D1 along the width direction of the photovoltaic module and a second dimension D2 along the length direction of the photovoltaic module;
wherein each of the solar cells (111) has two slices, and D1:D2 satisfies: 2<D1:D2≤2.02;
or each of the solar cells (111) has three slices, and D1:D2 satisfies: 3.01≤D1:D2≤3.03;
or each of the solar cells (111) has four slices, and D1:D2 satisfies: 4.01≤D1:D2≤4.04.

7. The photovoltaic module according to claim 1, wherein the distance L1 between two adjacent solar cell strings (11) along the width direction of the photovoltaic module satisfies: 0.3 mm≤L1≤1 mm.

8. The photovoltaic module according to claim 1, wherein at least two limiting members (6) of the limiting members (6) are arranged between two adjacent solar cell strings (11), and the at least two limiting members (6) are spaced apart along a length direction of the photovoltaic module.

9. The photovoltaic module according to claim 6, wherein the solar cells (111) in a same solar cell string (11) are connected by stitch welding.

10. The photovoltaic module according to claim 1, wherein the photovoltaic module is manufactured by a method comprising:
providing a photovoltaic cell pack (1), the photovoltaic cell pack (1) comprising solar cell strings (11);

providing a front packaging structure and a back packaging structure, wherein the front packaging structure comprises a front sheet (2) and a front packaging layer (3), and the back packaging structure comprises a back sheet (4) and a back packaging layer (5);

stacking the front sheet (2), the front packaging layer (3), the photovoltaic cell pack (1), the back packaging layer (5), and the back sheet (4), and arranging the solar cell strings (11) spaced apart in a width direction of the photovoltaic module, wherein a distance L1 between two adjacent solar cell strings (11) satisfies: 0.3 mm≤L1≤1.5 mm; and laminating the front sheet (2), the front packaging layer (3), the photovoltaic cell pack (1), the back packaging layer (5), and the back sheet (4) to form the photovoltaic module.

11. The photovoltaic module according to claim 10, wherein, when the solar cell strings (11) are spaced apart in the width direction of the photovoltaic module, the method comprises:

arranging a limiting member (6) between two adjacent solar cell strings (11), and clamping at least part of a main body portion (61) of the limiting member (6) between the two adjacent solar cell strings (11).

12. The photovoltaic module according to claim 11, wherein, when the limiting member (6) is arranged between two adjacent solar cell strings (11), the method comprises:

placing the solar cell strings (11) and the limiting member (6) sequentially along the width direction of the photovoltaic module.

13. The photovoltaic module according to claim 12, wherein the limiting member (6) further comprises a first connecting portion (62) and a second connecting portion (63), the first connecting portion (62) and the second connecting portion (63) are fixedly connected to two ends of the main body portion (61) along a height direction of the photovoltaic module; and a cross-section of the limiting member (6) is Z-shaped, and when the solar cell strings (11) and the limiting member (6) are placed sequentially along the width direction of the photovoltaic module, the method comprises:

placing one solar cell string (11) of the solar cell strings (11);

placing the limiting member (6), and connecting one of the first connecting portion (62) and the second connecting portion (63) to the one solar cell string (11); and placing another one solar cell string (11) of the solar cell strings (11), and connecting the another one solar cell string (11) to the other one of the first connecting portion (62) and the second connecting portion (63), in such a manner that the two adjacent solar cell strings (11) jointly clamp the main body portion (61).

14. The photovoltaic module according to claim 11, wherein the limiting member (6) further comprises a first connecting portion (62) and a second connecting portion (63), the first connecting portion (62) and the second connecting portion (63) are fixedly connected to two ends of the main body portion (61) along a height direction of the photovoltaic module; and a cross-section of the limiting member (6) is C-shaped, and when the limiting member (6) is arranged between two adjacent solar cell strings (11), the method comprises:

connecting a lower surface of the first connecting portion (62) and an upper surface of the second connecting portion (63) respectively to the light-facing surface and the backlight surface of a solar cell string (11) of the two adjacent solar cell strings (11), in such a manner that the limiting member (6) is clamped on the solar cell string (11) to form a solar cell string assembly; and placing solar cell string assemblies sequentially along the width direction of the photovoltaic module, in such a manner that the two adjacent solar cell strings (11) jointly clamp the main body portion (61).

15. The photovoltaic module according to claim 11, wherein at least one limiting member (6) is provided, the at least one limiting member (6) and the front packaging layer (3) are integrally formed, one of the at least one limiting member (6) and the front packaging layer (3) define an accommodation space, and when one limiting member (6) of the at least one limiting member (6) is arranged between two adjacent solar cell strings (11), the method comprises:

accommodating the solar cell strings (11) in the accommodation space, in such a manner that the two adjacent solar cell strings (11) jointly clamp the main body portion (61);

and/or at least one limiting member (6) is provided, the at least one limiting member (6) and the back packaging layer (5) are integrally formed, one of at least one limiting member (6) and the back packaging layer (5) define an accommodation space, and when the limiting member (6) is arranged between two adjacent solar cell strings (11), the method comprises:

accommodating the solar cell strings (11) in the accommodation space, in such a manner that the two adjacent solar cell strings (11) jointly clamp the main body portion (61).

16. The photovoltaic module according to claim 11, wherein, before the limiting member (6) is arranged between two adjacent solar cell strings (11), the method further comprises: arranging a positioning tape (7) on the two adjacent solar cell strings (11), wherein two ends of the positioning tape (7) are respectively bonded to the two adjacent solar cell strings (11) along the width direction (X) of the photovoltaic module; or wherein, after the limiting member (6) is arranged between two adjacent solar cell strings (11), the method further comprises: arranging a positioning tape (7) on the two adjacent solar cell strings (11), wherein two ends of the positioning tape (7) are respectively bonded to the two adjacent solar cell strings (11) along the width direction (X) of the photovoltaic module.

* * * * *